United States Patent
Kurita et al.

(10) Patent No.: US 6,824,343 B2
(45) Date of Patent: Nov. 30, 2004

(54) SUBSTRATE SUPPORT

(75) Inventors: Shinichi Kurita, San Jose, CA (US); Wendell T. Blonigan, Union City, CA (US); Suhail Anwar, San Jose, CA (US); Toshio Kiyotake, Shika (JP); Hung T. Nguyen, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 104 days.

(21) Appl. No.: 10/084,762

(22) Filed: Feb. 22, 2002

(65) Prior Publication Data

US 2003/0161706 A1 Aug. 28, 2003

(51) Int. Cl.[7] .............................................. B65G 47/24
(52) U.S. Cl. .................. 414/217; 414/781; 414/783; 414/936; 414/939; 414/941
(58) Field of Search ........................... 414/217, 936, 414/939, 805, 227.04, 227.06, 781, 783, 941

(56) References Cited

U.S. PATENT DOCUMENTS

| | | | |
|---|---|---|---|
| 4,788,994 A | 12/1988 | Shinbara .................... 134/157 |
| 5,192,087 A | 3/1993 | Kawashima et al. .......... 279/71 |
| 5,322,079 A | 6/1994 | Fukutomi et al. ........... 134/153 |
| 5,376,216 A | 12/1994 | Yoshioka et al. ........... 156/345 |
| 5,636,960 A | * 6/1997 | Hiroki et al. ............... 414/781 |
| 5,775,000 A | 7/1998 | Maekawa et al. .............. 34/58 |
| 5,853,214 A | 12/1998 | Babbs et al. ................ 294/161 |
| 5,897,108 A | 4/1999 | Gordon et al. ............... 269/50 |
| 5,961,107 A | 10/1999 | Morghen .................... 269/47 |
| 5,974,681 A | 11/1999 | Gonzalez-Martin et al. ... 34/58 |
| 6,045,620 A | 4/2000 | Tepman et al. ............. 118/733 |
| 6,163,015 A | 12/2000 | Moore et al. ............... 219/404 |
| 6,167,893 B1 | 1/2001 | Taatjes et al. .............. 134/147 |
| 6,190,997 B1 | 2/2001 | Becker et al. .............. 438/401 |
| 6,262,582 B1 | 7/2001 | Barringer et al. ........... 324/755 |
| 6,328,296 B2 | 12/2001 | Tyveleijn .................... 269/297 |
| 6,485,248 B1 | * 11/2002 | Taylor, Jr. ................... 414/672 |

FOREIGN PATENT DOCUMENTS

| | | | |
|---|---|---|---|
| EP | 0 290 218 | 11/1988 | ........... H01L/21/00 |
| JP | 2000-306980 | 11/2000 | ........... H01L/21/68 |
| WO | 02/05331 | 1/2002 | ........... H01L/21/00 |

OTHER PUBLICATIONS

Copy of International Search Report dated Aug. 7, 2003 from corresponding PCT application, PCT/US03/04885.

* cited by examiner

*Primary Examiner*—Kathy Matecki
*Assistant Examiner*—Sang Kim
(74) *Attorney, Agent, or Firm*—Moser, Patterson & Sheridan LLP

(57) ABSTRACT

A method and apparatus for supporting a substrate is generally provided. In one aspect, an apparatus for supporting a substrate includes a support plate having a first body disposed proximate thereto. A first pushing member is radially coupled to the first body and adapted to urge the substrate in a first direction parallel to the support plate when the first body rotates. In another aspect, a load lock chamber having a substrate support that supports a substrate placed thereon includes a cooling plate that is moved to actuate at least one alignment mechanism. The alignment mechanism includes a pushing member that urges the substrate in a first direction towards a center of the support. The pushing member may additionally rotate about an axis perpendicular to the first direction.

28 Claims, 12 Drawing Sheets

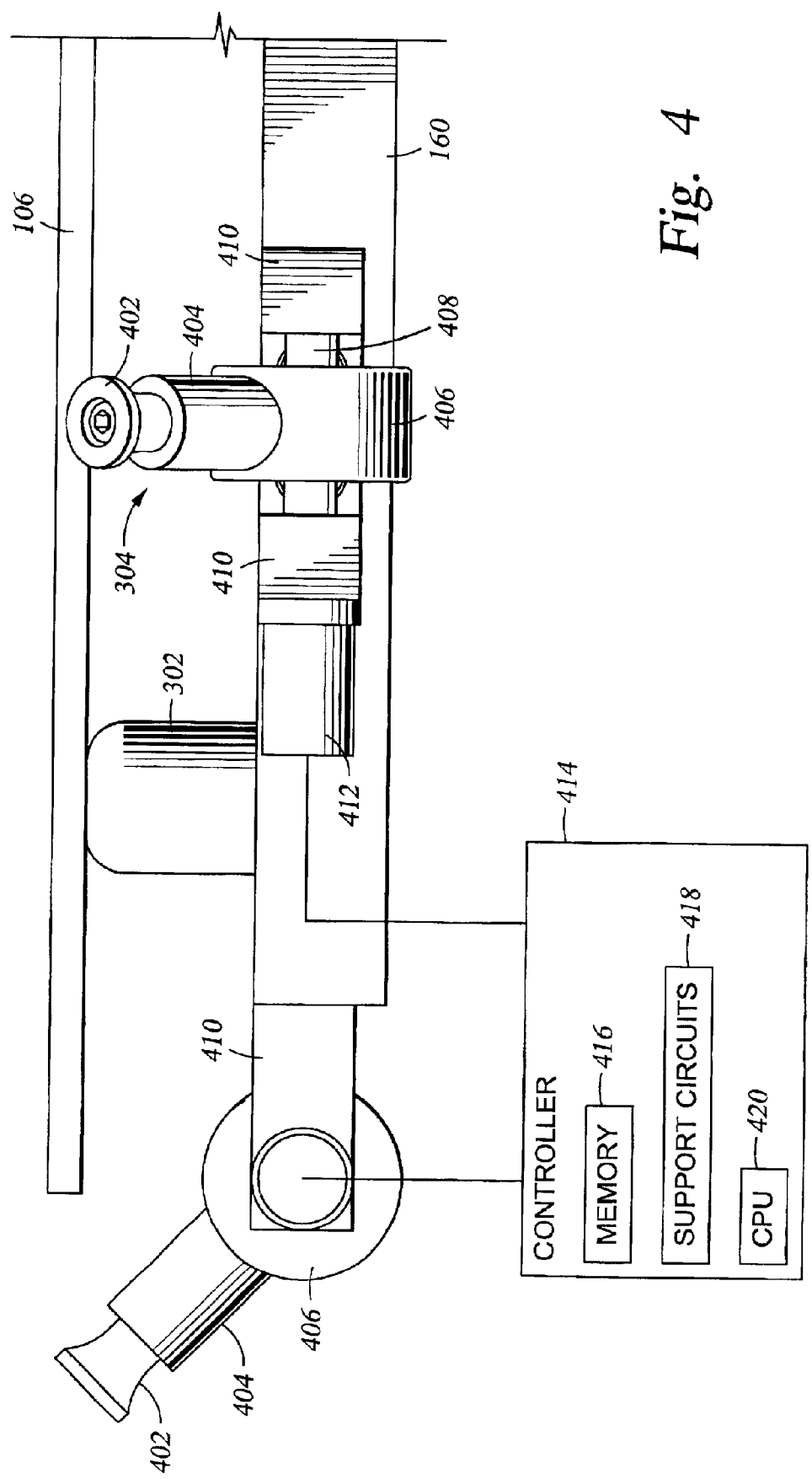

SUBSTRATE SUPPORT

FIELD OF THE INVENTION

Embodiments of the invention generally relate to a substrate support.

BACKGROUND OF THE INVENTION

Thin film transistors (TFTs) are conventionally made on large glass substrates or plates for use in monitors, flat panel displays, solar cells, personal digital assistants (PDAs), cell phones and the like. TFTs are made in a cluster tool by sequential deposition of various films including amorphous silicon, doped and undoped silicon oxides, silicon nitride and the like in a plurality of vacuum process chambers typically arranged around a central transfer chamber. The cluster tool is typically coupled to a factory interface that includes a plurality of substrate storage cassette that holds: substrates before and after processing. A load lock chamber is generally disposed between the factory interface and cluster tool to facilitate substrate transfer between a vacuum environment of the cluster tool and an atmospheric environment of a factory interface.

The positioning of glass substrates used for displays in a load lock chamber is difficult as compared to smaller, 200 mm and even 300 mm circular substrates. For example, as glass substrates often have dimensions exceeding 550 mm by 650 mm, with trends towards 1.2 square meters and larger, small deviations in position may result in significant substrate misalignment. A misaligned substrate has high probability of damage, resulting in a costly loss of the substrate. Moreover, a misaligned substrate must be manually removed from the load lock chamber, thereby requiring costly loss of production time and diminished substrate throughput.

Typically, the accuracy of substrate placement is controlled by a robot disposed in the factory interface that is utilized to move substrate's between the cassettes and the load lock. However, many end-users of cluster tools are now providing the factory interface and robot disposed therein. Thus, if the accuracy and repeatability of substrate placement by the user supplied robot is not within the designed specifications of the load lock chamber, substrate damage is likely. It would be desirable for the load lock chamber to be more compatible with regard to substrate placement so that tool components (i.e., user provided factory interfaces) may be used in order to reduce system costs while increasing design flexibility.

Therefore, there is a need for a load lock and substrate support that corrects the orientation and position of substrates placed thereon.

SUMMARY OF THE INVENTION

A method and apparatus for supporting a substrate placed on a substrate support is generally provided. In one embodiment, an apparatus for supporting a substrate includes a support plate having a first body disposed proximate thereto. A first pushing member is radially coupled to the first body and adapted to urge the substrate in a first direction parallel to the support plate when the first body rotates.

In another embodiment, an apparatus for supporting a substrate includes a plurality of pushing members, each having a first rotational axis and a second rotational axis orientated perpendicular to the first rotational axis. A first pushing member is adapted to urge the substrate in a first direction, a second pushing member is adapted to urge the substrate in a second direction that is opposite the first direction, a third pushing member is adapted to urge the substrate in a third direction, and a fourth pushing member is adapted to urge the substrate in a fourth direction that is opposite the third direction.

In another aspect, a load lock chamber having a substrate support that supports a substrate is provided. In one embodiment, the load lock chamber includes a chamber body having a substrate support plate disposed therein. A first body disposed is proximate to the support plate. A first pushing member is radially coupled to the first body and adapted to urge the substrate in a first direction parallel to the support plate when the first body rotates.

In yet another aspect, a method for aligning a substrate is provided. In one embodiment, a method for aligning a substrate on a substrate support includes placing a substrate on a support, elevating a cooling plate towards the support to actuate an alignment mechanism, and moving a first pushing member of the alignment mechanism towards a center of the support plate in response to the actuation to urge the substrate in a first direction.

In another embodiment, a method for aligning a substrate on a substrate support includes placing a substrate on a support, rotating a first pushing member to urge the substrate in a first direction, rotating a second pushing member to urge the substrate in a second direction different than the first direction.

BRIEF DESCRIPTION OF THE DRAWINGS

So that the manner in which the above recited features of the present invention are attained and can be understood in detail, a more particular description of the invention, briefly summarized above, may be had by reference to the embodiment thereof which are illustrated in the appended drawings. It is to be noted, however, that the appended drawings illustrate only typical embodiments of this invention and are therefore not to be considered limiting of its scope, for the invention may admit to other equally effective embodiments.

FIG. 4 is a side view of the alignment mechanism of FIG. 3;

To facilitate understanding, identical reference numerals have been used, wherever possible, to designate identical elements that are common to the figures.

DETAILED DESCRIPTION

The invention generally provides a substrate support having an alignment mechanism that aligns or centers a substrate disposed thereon to a predetermined position. The invention is illustratively described below utilized in a dual substrate load lock chamber, such as those available from AKT, a division of Applied Materials, Inc., Santa Clara, Calif. However, it should be understood that the invention has utility in other configurations, for example, single substrate load lock chambers, multiple substrate load lock chambers, robot hand-off platforms, buffer stations and other devices utilized to support a substrate where the positional accuracy of the substrate is desired.

Figure 1:
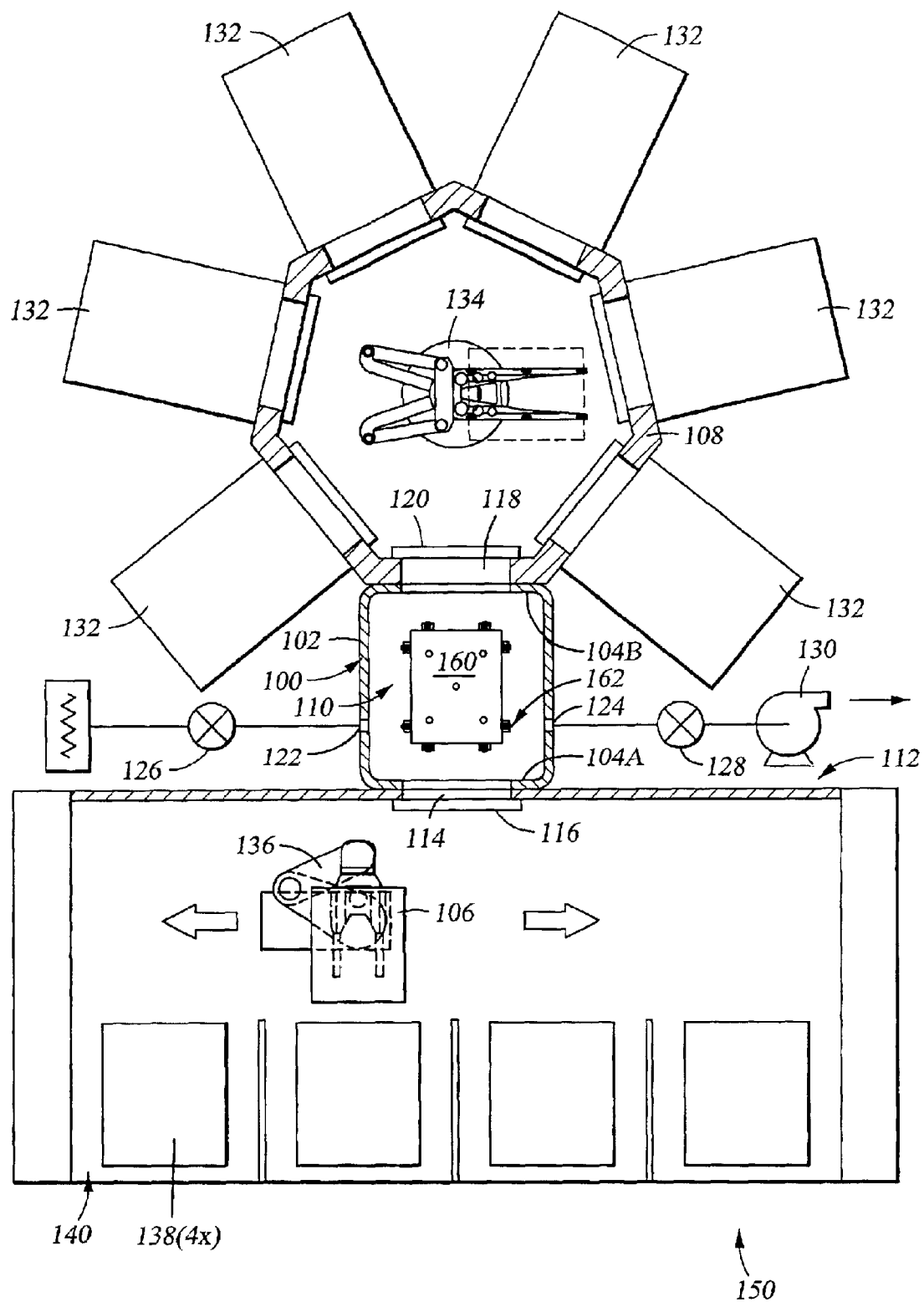
FIG. 1 is a cluster tool having one embodiment of a load lock chamber coupling the cluster tool to a factory interface.

FIG. 1 is a cross sectional view of one embodiment of a process system 150. The process system 150 typically includes a transfer chamber 108 coupled to a factory interface 112 by a load lock chamber 100 that has at least one substrate alignment mechanism 162. The transfer chamber 108 has at least one vacuum robot 134 disposed therein that is adapted to transfer substrates between a plurality of circumscribing process chambers 132 and the load lock chamber 100. In one embodiment, one of the process chambers 132 is a pre-heat chamber that thermally conditions substrates prior to processing to enhance throughput of the system 150. Typically, the transfer chamber 108 is maintained at a vacuum condition to eliminate the necessity of adjusting the pressures between the transfer chamber 108 and the individual process chambers 132 after each substrate transfer.

The factory interface 112 generally includes a plurality of substrate storage cassettes 138 and an atmospheric robot 136. The cassettes 138 are generally removably disposed in a plurality of bays 140 formed on one side of the factory interface 112. The atmospheric robot 136 is adapted to transfer substrates 106 between the cassettes 138 and the load lock chamber 100. Typically, the factory interface 112 is maintained at or slightly above atmospheric pressure.

Figure 2:
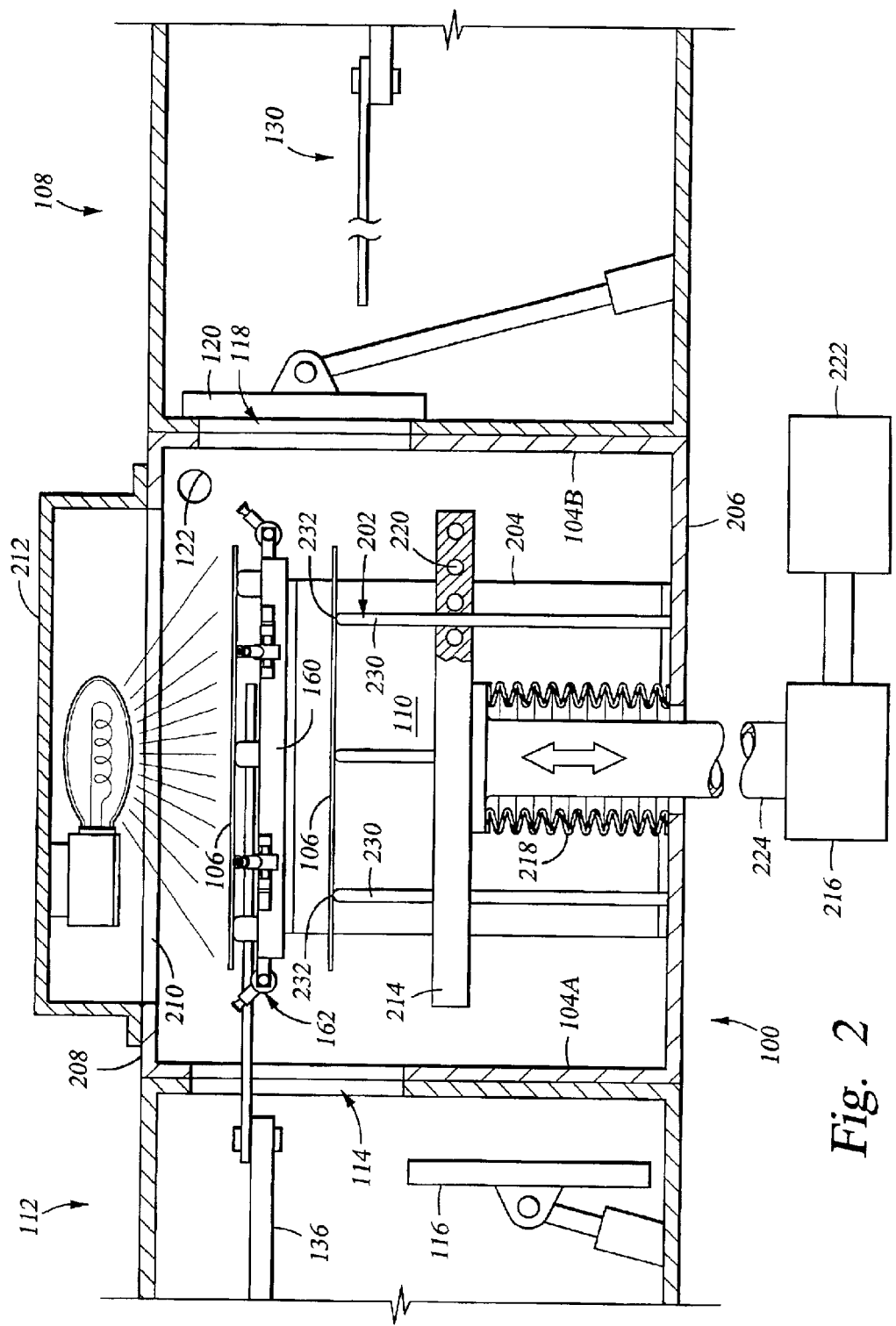
FIG. 2 is a sectional view of the load lock chamber of FIG. 1.

FIG. 2 is a sectional view of one embodiment of the load lock chamber 100. The load lock chamber 100 includes a body 102 having walls 104A, 104B, a bottom 206 and a top 208 that define a sealable internal volume 110. The load lock chamber 100 is typically coupled to a factory interface 112 through a port 114 disposed in the wall 104A. A slit valve 116 selectively seals the port 114 to isolate the atmospheres of the internal volume 110 of the load lock chamber 100 and the factory interface 112. The slit valve 116 may be opened to allow a substrate 106 to pass through the port 114 between the factory interface 112 and the load lock chamber 100.

The load lock chamber 100 is typically coupled to the transfer chamber 108 through a port 118 disposed in the wall 104B. A slit valve 120 selectively seals the port 118 to selectively isolate the atmospheres of the internal volume 110 of the load lock chamber 100 and the transfer chamber 108. The slit valve 120 may be opened to allow the substrate 106 to pass between the transfer chamber 108 and the load lock chamber 100. Examples of slit valves that may be adapted to benefit from the invention are described in U.S. Pat. No. 5,579,718, issued Dec. 3, 1996 to Freerks and U.S. Pat. No. 6,045,620, issued Apr. 4, 2000 to Tepman et al., both of which are hereby incorporated by reference in their entireties.

The chamber body 102 additionally includes at least one port disposed therethrough to facilitate controlling the pressure within the interior volume 110. In the embodiment depicted in FIG. 1, the chamber body 102 includes a vent port 122 and a vacuum port 124 formed through the chamber body 102. Valves 126, 128 are respectfully coupled to the vent port 122 and vacuum port 124 to selectively prevent flow therethrough. The vacuum port 122 is coupled to a vacuum pump 130 that is utilized to selectively lower the pressure within the interior volume to a level that substantially matches the pressure of the transfer chamber 108. When the pressures between the transfer chamber 108 and the load lock chamber 100 are substantially equal, the slit valve 120 may be opened to allow processed substrates to be transferred to the load lock chamber 100 and substrates to be processed transferred to the transfer chamber 108 by the vacuum robot 124.

After placing the substrate returning from the transfer chamber 108 in the load lock chamber 100, the slit valve 120 is closed and the valve 126 is opened thereby allowing air into the load lock chamber 100 and raising the pressure within the internal volume 110. Typically, the air entering the interior volume 110 through the vent port 122 is filtered to minimize potential particulate contamination of the substrate. Once the pressure within in the load lock chamber 100 is substantially equal to that of the factory interface 112, the slit valve 116 opens, thus allowing the atmospheric robot 136 to transfer of substrates between the load lock chamber 100 and the substrate storage cassettes 138 coupled to the factory interface 112.

In order to minimize the precision and accuracy required of the atmospheric robot 136, a support plate 160 disposed within the load lock chamber 100 and adapted to receive substrates from the atmospheric robot 136, is equipped with at least one alignment apparatus 162 that positions the substrate 106 relative to the support plate 160. For example, the alignment apparatus 162 may correct positional inaccuracies between a deposited position of the substrate 106 as placed by the atmospheric robot 136 on the support plate 160 and a predefined (i.e., designed) position of the substrate 106 relative the support plate 160. Having the position of the substrate 106 aligned by the alignment apparatus 162 within the load lock chamber 100 independent from conventional correction methods that utilize the atmospheric robot 136 to adjust the substrate placement allows greater flexibility and lower system costs. For example, the support plate 160 with alignment apparatus 162 provides greater compatibility between the load lock chamber 100 and user supplied factory interfaces 112 since the load lock chamber 100 is more tolerant to substrate position on the support plate 160, thereby reducing the need for robots of great precision and/or corrective robot motion algorithms generated by the factory interface provider. Moreover, as the positional accuracy designed criteria for the atmospheric robot 136 is diminished, less costly robots may be utilized.

The first support plate 160 shown in FIG. 2, has the alignment mechanisms 162 disposed over a second substrate support 202 in a dual substrate handling configuration. Embodiments of the invention, however, includes at least one substrate support plate having an alignment mechanism, which may be utilized with zero or a plurality of additional support plates, some, all or none of which may include alignment mechanisms.

Figure 3:
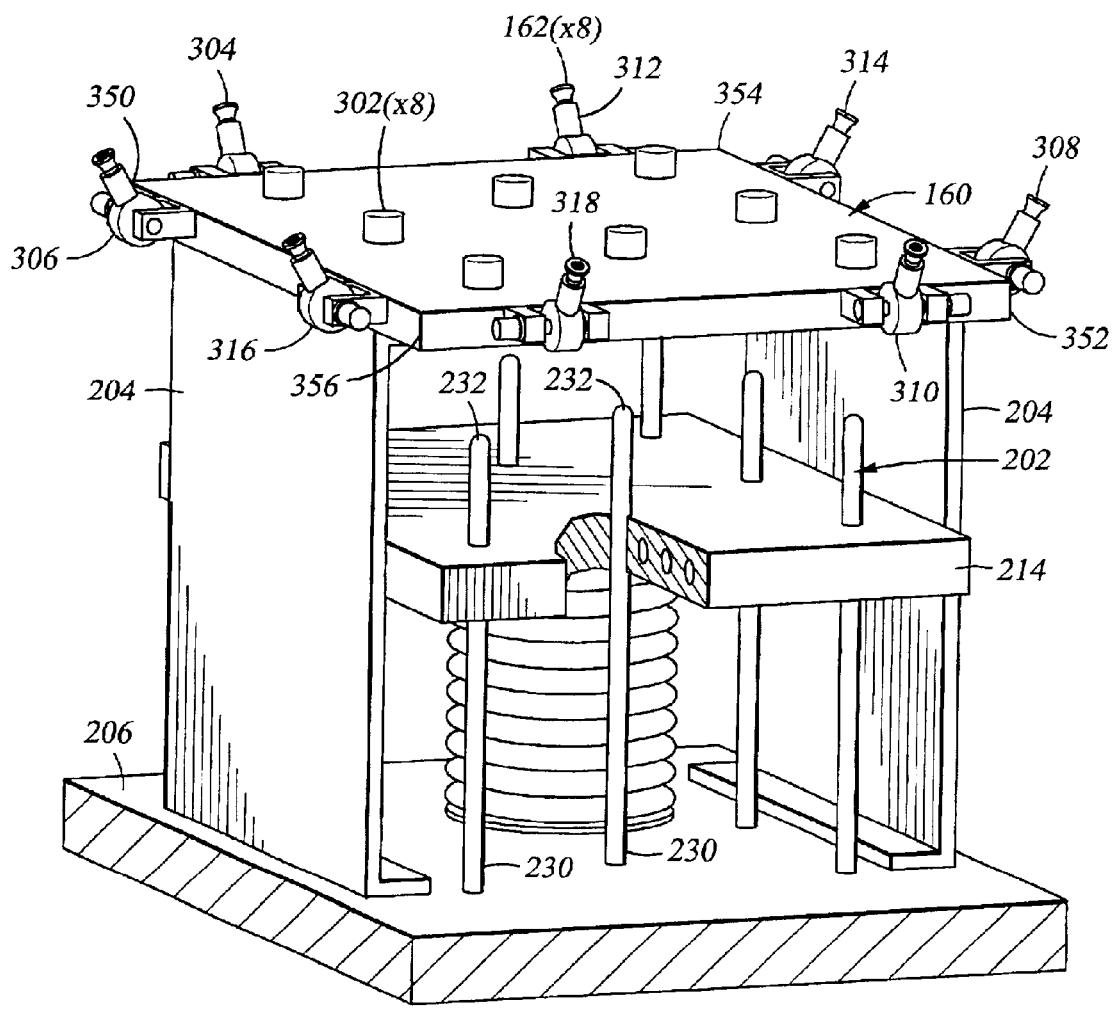
FIG. 3 is an isometric view of a first support plate having one embodiment of an alignment mechanism.

The first support plate 160 and the second support 202 are generally configured to respectively hold substrates in a stacked parallel orientation within the load lock chamber 100 in a position accessible to both the atmospheric and vacuum robots 136, 134. Typically, the first support plate 160 is utilized for holding substrates entering the transfer chamber 106 while the second support 202 is utilized for holding substrates returning to the factory interface 112. The first support plate 160 is coupled to the chamber body 102, typically to the bottom 206. As seen in FIGS. 2 and 3, stanchions 204 couple the first support plate 160 to the chamber bottom 206. The stanchions 204 are generally positioned in a spaced-apart relationship to facilitate placement of a substrate on the second support 202. The stanchions 204 are additionally spaced wide enough to allow movement of the cooling plate 214 therebetween.

The second support 202 generally holds a substrate between the first support plate 160 and the chamber bottom 206. The second support 202 may be a plate supported by the stanchions 204 or other member. In the embodiment depicted in FIGS. 2 and 3, the second support 202 comprises a plurality of substrate support posts 230 coupled to the chamber bottom 206, each post 230 having a distal end 232 defining a generally planar, substrate supporting surface. The posts 230 are generally arranged not to interfere with the robots 134, 136 during substrate transfer.

Thermal control of the substrates may additionally be practiced within the load lock chamber 100. For example, the top 208 of the chamber body 102 may include a window 210 having a radiant heater 212 mounted thereover. The heater 212 illuminates the substrate through the window 210 to heat the substrate disposed on the first support plate 160. A cooling plate 214 may additionally be disposed between the first support plate 160 and the bottom 206 of the chamber body 102. The cooling plate 214 includes a plurality of apertures 228 formed therethrough that allow the posts 230 to be disposed through the cooling plate 214. Typically, the cooling plate 214 is coupled to a lift mechanism 216 disposed outside the load lock chamber 100. The lift mechanism 216 may be actuated to move the cooling plate 214 along the posts 230. The lift mechanism 216 moves the cooling plate 214 in close proximately to the substrate retained on the distal ends 232 of the second support 202 thereby cooling the substrate prior to handling by the atmospheric robot. Optionally, the cooling plate 214 may lift the substrate off of the section support 202 to maximize heat transfer. Typically, the cooling plate 214 is coupled to the bottom 206 of the chamber body 102 by a dynamic seal, for example, a bellows 218. In one embodiment, the cooling plate 214 includes one or more conduits 220 coupled to a heat transfer fluid source 222 through a shaft 224 that couples the cooling plate 214 to the lift mechanism 216. Fluid, from the fluid source 222, is flowed through the conduits 220 to remove heat transferred from the substrate to the second support 202.

FIG. 3 depicts an isometric view of the first support plate 160 and the second support 202. The first support plate 160 generally includes a plurality of support elements 302 that are adapted to maintain the substrate in a spaced-apart relation relative to the first support plate 160. The height of the support elements 302 is generally configured to allow a blade of the robots 136, 134 between the substrate seated on the support elements 302 and the support plate 160. Optionally, channels may be formed in the support plate 180 between the support elements 302 to provide space for the blade of the robots 136, 134. The support elements 302 additionally allow the substrate to move parallel to a plane of the first support plate 160 without scratching or otherwise damaging the substrates. The support elements 302 may be low friction pads, roller balls or air bearings among others. In the embodiment depicted in FIG. 3, the support elements 302 are plastic pads, for example, fabricated from a fluoropolymer. The distal ends 232 of the second support 202 may also include support elements 302 to minimize potential damage to the substrate.

The first support plate 160 is typically circumscribed by a plurality of alignment mechanisms 162. The alignment mechanisms 162 may be coupled to the support plate 160 or alternatively to a portion of the chamber body 102. The alignment mechanisms 162 are adapted to cooperatively ensure placement of a substrate in a predetermined position relative to the support plate 160. Generally, a first pair of alignment mechanisms are configured to align a substrate therebetween along a first coordinate axis while a second pair of alignment mechanisms are configured to align the substrate therebetween in a second coordinate axis, thereby cooperatively moving the substrate into a predetermined position. Typically, the first coordinate axis is orientated perpendicular to the second coordinate axis.

In the embodiment depicted in FIG. 3, a first pair of alignment mechanisms 304, 306 are disposed on adjacent sides of a first corner 350 of the first support plate 160 while a second pair of alignment mechanisms 308, 310 are disposed on adjacent sides of a diagonally facing second corner 352. The opposing alignment mechanisms 162 of each facing pair of alignment mechanisms (i.e., 306, 308 and 304, 310) are adapted to move the substrate in opposite directions, thereby centering the substrate therebetween. Moreover, as the alignment mechanisms are typically coupled offset from the midpoint of the support plate 160, skew of the substrate may also be corrected as the alignment mechanisms 162 move the substrate to a predetermined position relative to the support plate 160. Alternatively, the alignment mechanism 162 may be positioned anywhere along each side of the support plate 160 (i.e., not in the corner of the support plate 160). Additionally, the invention contemplates using a single alignment mechanism 162 along one side of the support plate 160 that cooperates with conventional alignment devices to align the substrate.

In the embodiment depicted in FIG. 3, a third pair of alignment mechanisms 312, 314 and a fourth pair of alignment mechanisms 316, 318 are disposed in third and fourth diagonal corners 354, 356 of the first support plate 160. The second pair of alignment mechanisms provides an additional measure of accuracy when aligning the substrate on the first support plate 160.

FIG. 4 depicts a partial front view of the first support plate 160 and one embodiment of an alignment mechanism 304. The other alignment mechanisms are similarly constructed in one embodiment. The alignment mechanism 304 generally includes a pushing member 402 coupled by an arm 404 to a body 406. The body 406 has a shaft 408 disposed therethrough. The shaft 408 is coupled to the first support plate 160 by a pair of mounting brackets 410 disposed to either side of the body 406. The shaft 408 is coupled to an actuator 412 that may be energized or prompted in another manner to cause the pushing member 402 to rotate about the shaft 408. The actuator 412 is typically coupled to a controller 414.

The controller 414 generally includes a central processing unit (CPU) 420, support circuits 418 and memory 416. The CPU 420 may be one of any form of computer processor that can be used in an industrial setting for controlling the motion of the pushing member 402. The memory 416 is coupled to the CPU 420. The memory 416, or computer-readable medium, may be one or more of readily available memory such as random access memory (RAM), read only memory (ROM), floppy disk, hard disk, or any other form of digital storage, local or remote. The support circuits 418 are coupled to the CPU 420 for supporting the processor in a conventional manner. These circuits include cache, power supplies, clock circuits, input/output circuitry, subsystems, and the like.

The controller 414 generally provides a signal to the actuator 412 causing the actuator 412 to impart a rotary motion to the shaft 408. In the embodiment depicted in FIG. 4, the actuator 412 may be a servo, stepper, or other electrical motor, a pneumatic motor, a hydraulic motor, or a rotary solenoid among other devices or combination of mechanisms that may provide rotation to the shaft 408, for example, a linear actuator coupled eccentrically to the shaft 408.

Figure 5A:
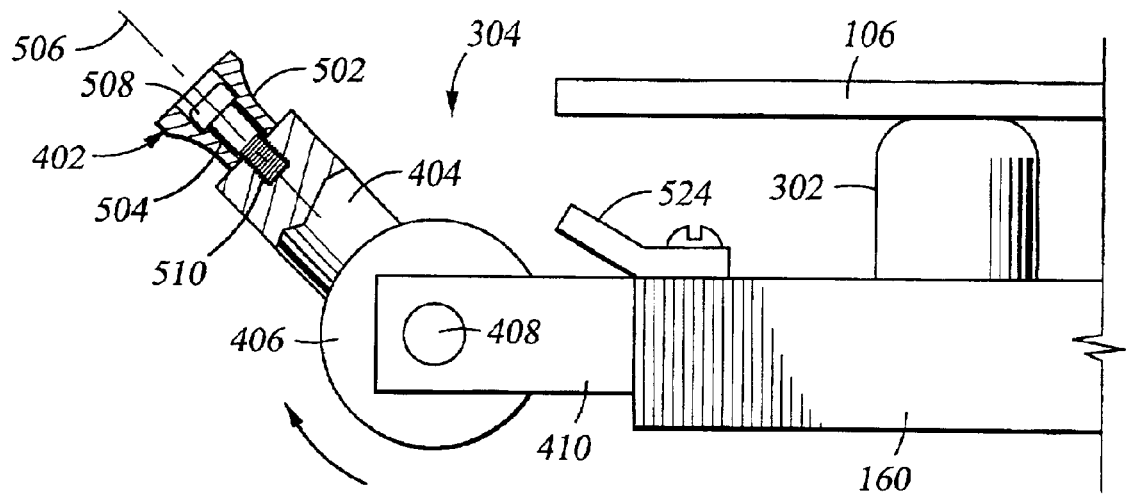
FIGS. 5A–C are side and plan views of the alignment mechanism of FIG. 4 in an actuated and un-actuated state.
Figure 5B:
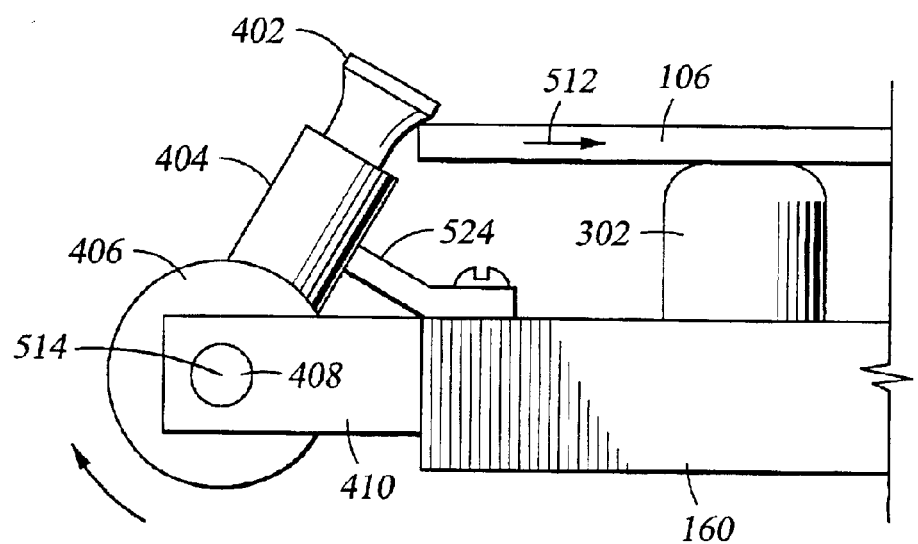
Figure 5C:
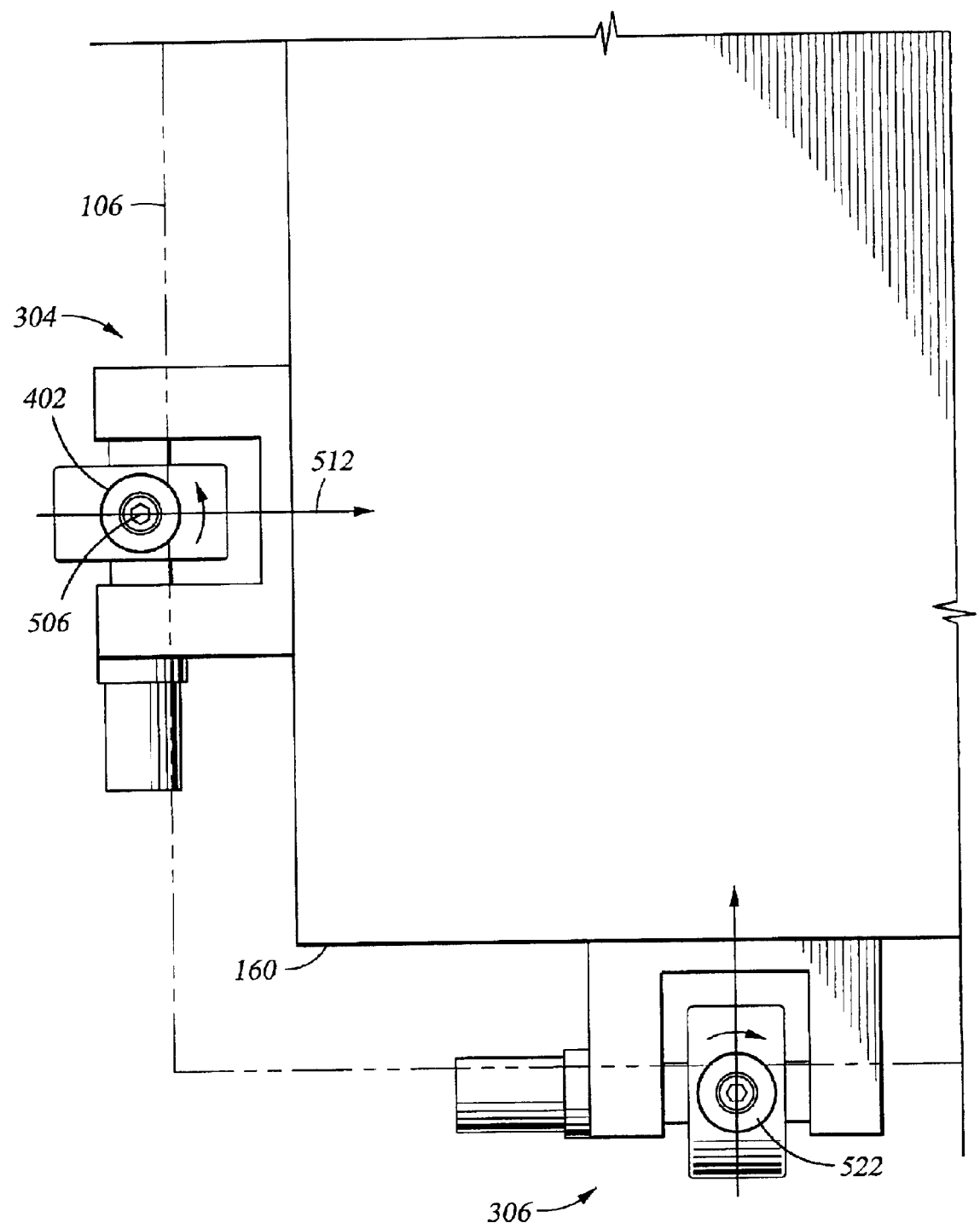

Referring to FIGS. 5A–C, as the actuator 412 causes the shaft 408 to rotate, the pushing member 402 moves towards a center region of the first support plate 160. The pushing member 402 is generally fabricated from a material that does not scratch, damage or otherwise contaminate the substrate 106. In one embodiment, the pushing member 402 is fabricated from a polymer, for example, a fluoropolymer.

The pushing member 402 generally includes a face 502 that contacts a misaligned substrate 106 as the alignment mechanism 304 is rotated. The face 502 generally pushes the substrate 106 in a first direction 512 into a predefined position. Typically, the first direction 512 is perpendicular to a rotational axis 514 of the shaft 408 and at an angle to the face 502. In one embodiment, the face 502 is concave to prevent the substrate 106 from lifting as the pushing member 402 rotates, thus ensuring movement of the substrate across the spacing elements 302 in the first direction 512. After rotating the pushing member 402 towards the center of the support plate 160, the actuator 412 generally returns the alignment mechanism 304 to the position depicted in FIG. 5A where the pushing member 402 is clear of the substrate to facilitate substrate transfer.

The pushing member 402 is additionally configured to rotate about a central axis 506 that is typically disposed perpendicular to the rotational axis 514. The ability of the pushing member 402 to rotate facilitates movement of the substrate 106 laterally relative to the pushing member 402. Thus, to allow the substrate to move tangentially across the pushing member 402, the face 502 is generally configured symmetrically about the central axis 506. For example, if the adjoining alignment mechanism 306 (as depicted in FIG. 5C) is also in contact with the substrate during the alignment process (i.e., the rotation of the respective alignment mechanisms 304, 306 towards the center of the support plate 160), the substrate 106 is moved simultaneously in two directions. As the pushing member 402 can rotate about its axis 506, the substrate may move laterally while in contact with the pushing member due to the force imparted by alignment mechanism 306 without undue additional friction or particulate generation. Likewise, the alignment mechanism 306 has a pushing member 522 that rotates about its axis enabling lateral movement of substrates that are in contact therewith. Thus, the pushing members 402, 522 allow the substrate to move laterally in one direction while imparting movement to the substrate in a second, typically perpendicular, direction.

In one embodiment, a fastener 508 is disposed through a hole 504 that is formed along the axis 506 of the pushing member 402 and threaded into a threaded hole 510 formed in the arm 404 to facilitate rotation of the pushing member 402. Other configurations for rotationally coupling the pushing member 402 may alternatively be utilized. The pushing member 522 is similarly coupled to the alignment mechanism 306.

To place the substrate 106 in a predefined position, the rotation, or throw of the pushing member 402 about the axis 514 is typically limited mechanically or electronically. For example, the controller 414 may signal the actuator 412 to limit the rotation of the pushing member 402 to a predetermined angle. In the embodiment depicted in FIGS. 5A–B, a mechanical stop 524 is placed in a position that limits the angular rotation of the alignment mechanism 304. For example, the stop 524 may be coupled to the support plate 160 in a location that stops the arm 404 at a predetermined angle relative the support plate 160. Other configurations and methods for controlling and/or limiting the movement of the pushing member 402 may alternatively be utilized.

Figure 6:
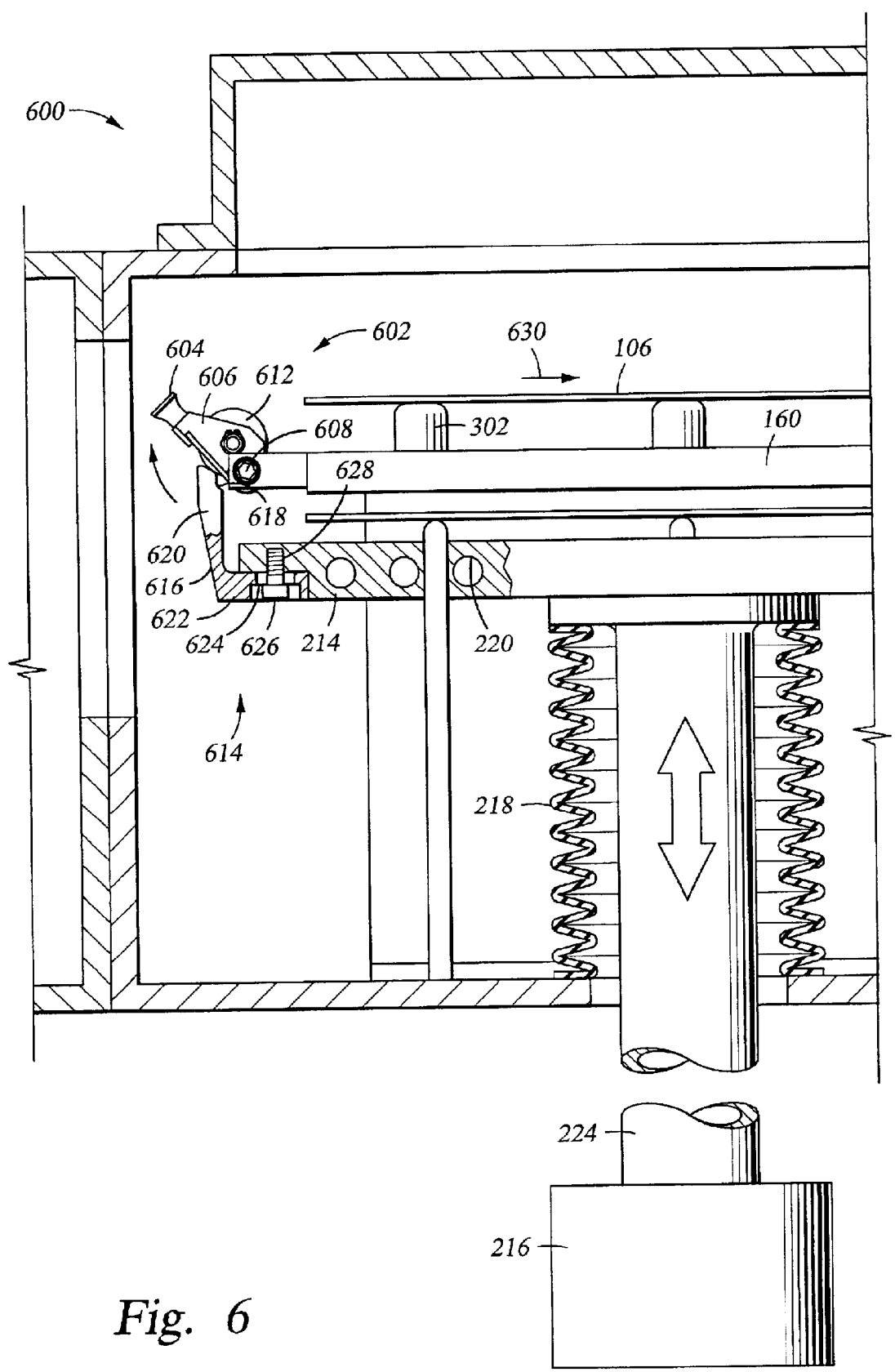
FIG. 6 is a partial sectional view of a load lock chamber having another embodiment of an alignment mechanism.

FIG. 6 is a partial sectional view of a load lock chamber 600 having another embodiment of an alignment mechanism 602. The load lock chamber 600 is generally similar to the load lock chamber 100 described above, and generally includes at least four alignment mechanisms, one disposed along each side of a substrate disposed within the chamber 600, of which only alignment mechanism 602 is shown in FIG. 6. Generally, at least two pairs of alignment mechanisms 602 are utilized across diagonal corners of a substrate 604 as described with reference to FIG. 3. Optionally, additional alignment mechanisms 602 may be utilized along any of the edges of the substrate 602, and/or utilized across both diagonal corners of the substrate.

The alignment mechanism 602 generally includes a pushing member 604 coupled by an arm 606 to a shaft 608. A mounting bracket, 608 couples the shaft 608 to the support plate 160. Generally, an actuator 614 interfaces with the alignment mechanism 602 to cause a misaligned substrate to move in a first direction 630. Typically, the first direction 630 is perpendicular to the shaft 608 about which the arm 606 and pushing member 604 rotate.

In the embodiment depicted in FIG. 6, the actuator 614 includes the cooling plate 214 and an actuation finger 616 coupled thereto. As the cooling plate 214 is elevated by the lift mechanism 216, the actuation finger 616 contacts the alignment mechanism 602, causing the alignment mechanism 602 to rotate the pushing member 604 towards the center of the support plate 160. To minimize particulate generation between the actuation finger 616 and the alignment mechanism 602, a roller 612 is coupled to the arm 606 in a position that allows the actuation finger 616 to ride thereover as the cooling plate 214 is elevated. The roller 612 is typically fabricated from a plastic, for example, a fluoropolymer, and rotates while in contact with the actuation finger 616 to further minimize particulate generation.

To control the throw and rate of movement of the pushing member 604, a vertical first portion 620 of the actuation finger 616 has a contoured face 618 that engages the roller 612 during actuation. The contoured face 618 may be straight, curved or have a complex shape which is configured to move the pushing member 604 at a predetermined rate or rates through a predetermined angular rotation. A second portion 622 of the actuation finger 616 includes a slot 624 that accepts a fastener 626 that threads into a threaded hole 628 formed in the cooling plate 214. The slot 624 allows the position of the actuation finger 616 to be adjusted relative to the support plate 160, thus setting the relative position of the contoured face 618 and roller 612 thereby providing increased range of pushing member motion adjustment.

Figure 7:
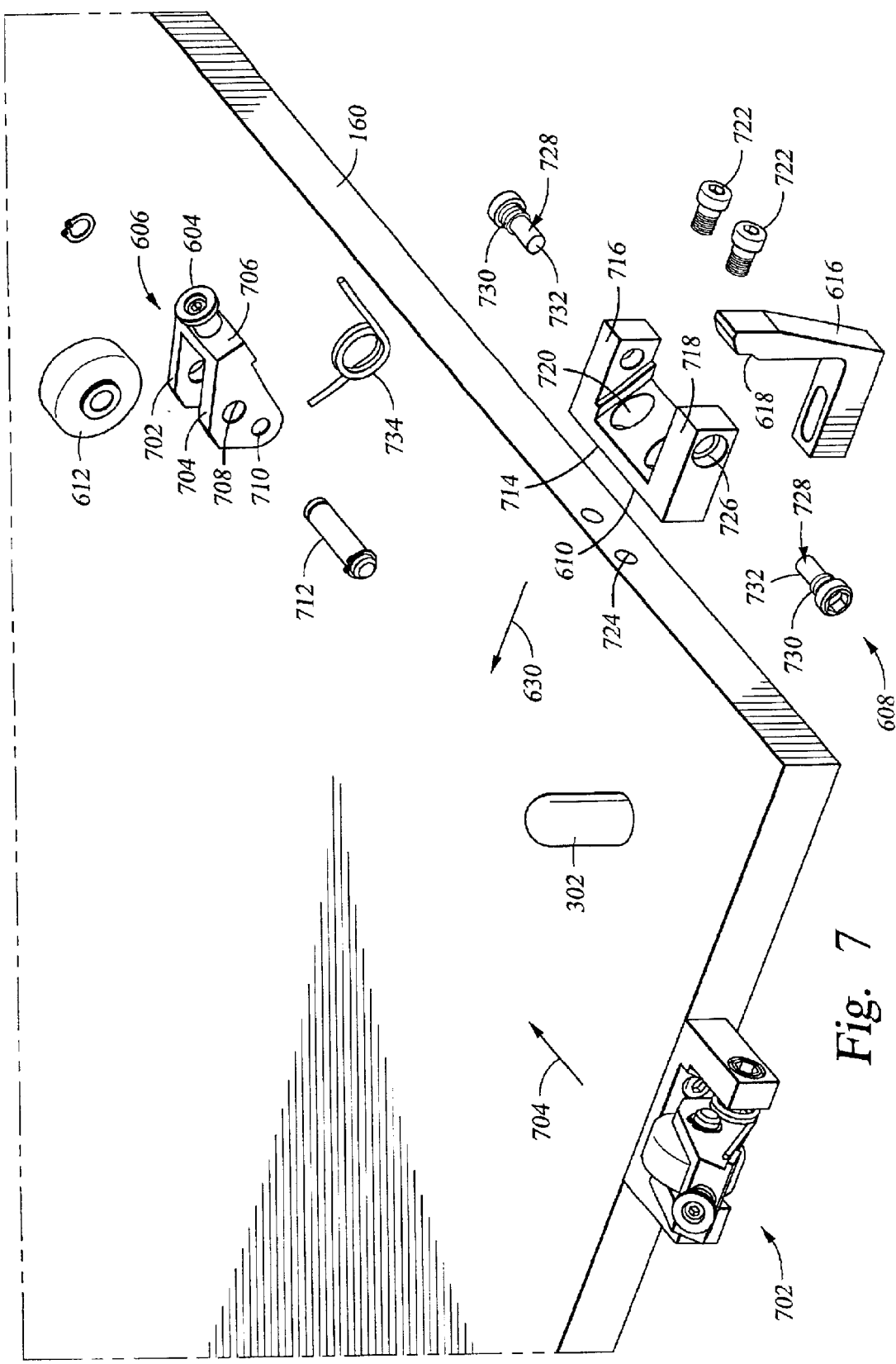
FIG. 7 is an exploded isometric view of the alignment mechanism of FIG. 6.

FIG. 7 depicts an exploded view of one embodiment of the alignment mechanism 602. The arm 404 of the alignment mechanism 602 generally includes a first flange 702 and a second flange 704 coupled by a center portion 706. The center portion 706 has the pushing member 604 rotationally coupled thereto. The second flange 704 is obscured by the roller 612 but is substantially similar to the first flange 702. The first and second flanges 702, 704 each have a first hole 708 and a second hole 710 formed therein. The first hole 708 is configured to accept a dowel pin 712 that provides a rotational axis for the roller 612. The rotational axis of the roller 612 is generally parallel to the shaft 608 and perpendicular to a rotational axis of the pushing member 604. The second hole 710 generally accepts the shaft 608 that allows the arm 604 to rotate.

The mounting bracket 610 generally includes a base 714 having first and second members 716, 718 extending therefrom in a "U-shaped" configuration. The base 714 has a plurality of mounting holes 720 formed therethrough that facilitate coupling the mounting bracket 610 to the support plate 160. In the embodiment depicted in FIG. 7, a pair of fasteners 722 pass through the holes 720 and thread into a threaded hole 724 formed in the support plate 160.

Each member 716, 718 of the mounting bracket 610 includes an aperture 726 that accepts the shaft 608. In the embodiment depicted in FIG. 7, the shaft 608 comprises a pair of shaft elements 728. Each of the shaft elements 728 has a threaded end 730 and a rod end 732. The threaded ends 730 of the shaft elements 728 engage each member 716, 718 of the mounting bracket 610 while allowing the rod ends 732 to protrude through the holes 726. The rod ends 732 are respectively disposed in the second holes 710 of the first and second flanges 702, 704 of the arm 404, thereby allowing the arm 404 to rotate relative to the mounting bracket 410.

Additionally, a basing member 734 is disposed between one of the flanges 702, 704 and the arm 606. The basing member 734 generally urges the arm 606 to rotate about the shaft 608 in a direction that moves the pushing member 604 away from the support plate 160. Thus, as the actuation finger 616 is moved to contact the roller 612, the basing member 734 ensures close contact between the roller 612 and the contoured face 618, thereby causing the resulting motion of the pushing member 604 to have a predetermined range and rate. The biasing member 734 additionally allows the pushing member 604 to swing clear of the support plate 160 after the alignment process as not to interfere with substrate transfer. In one embodiment, the biasing member 734 is a torsion spring.

Figure 8A:
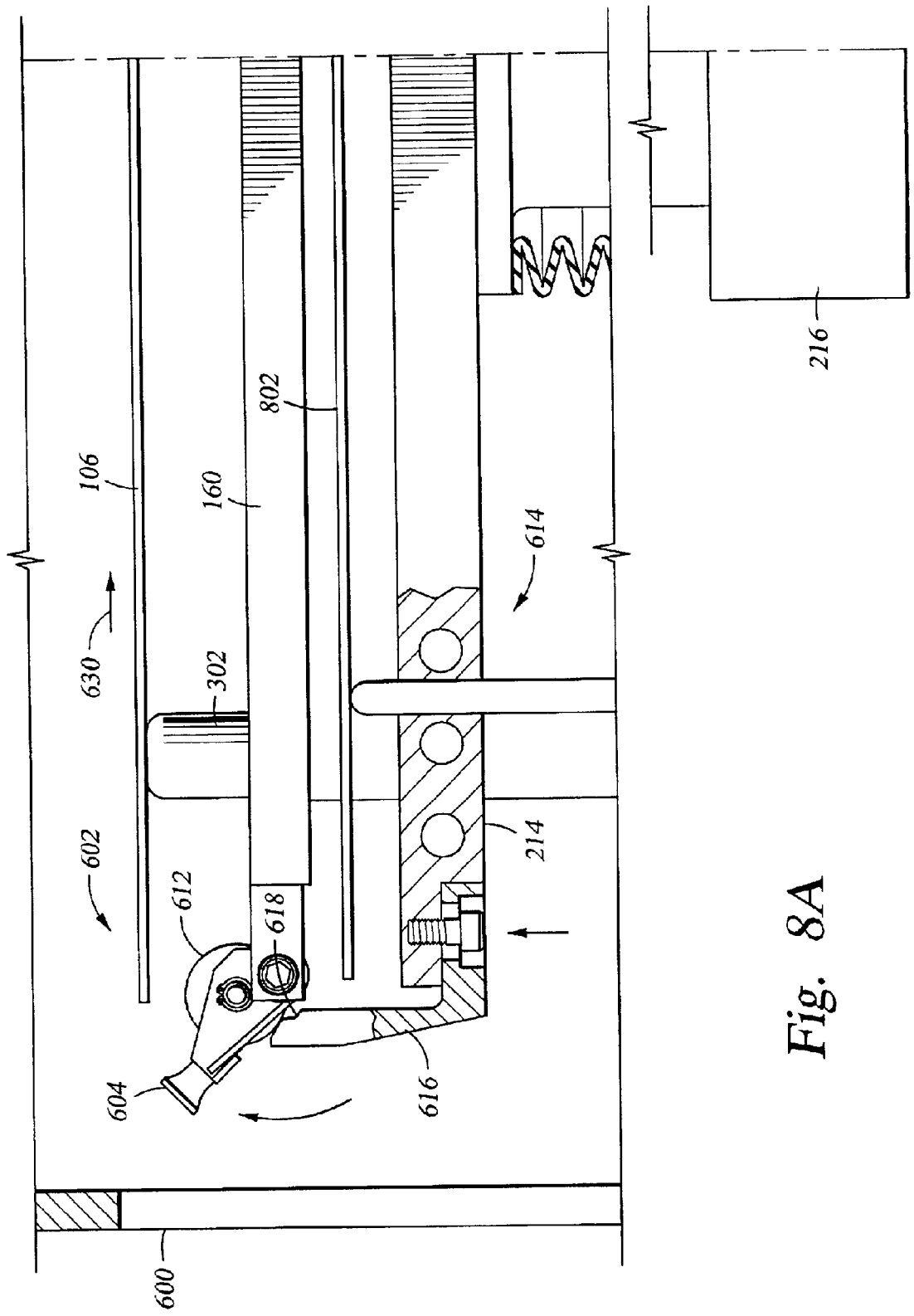
FIGS. 8A–B are sectional views of the alignment mechanism of FIG. 6 in an actuated and un-actuated state.
Figure 8B:
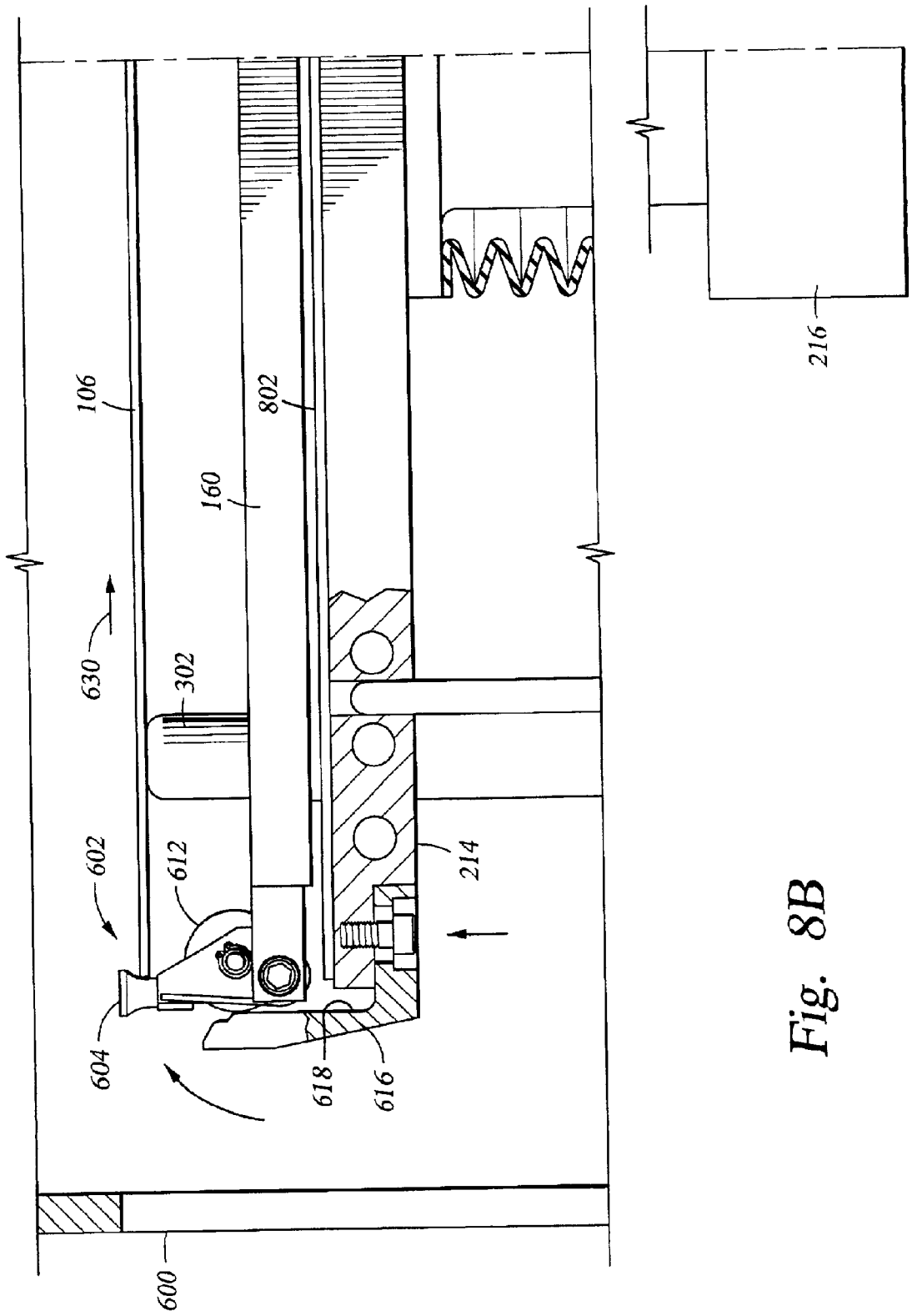

FIGS. 8A–B depict the alignment mechanism 602 in an unactuated and actuated state moving the substrate in a first direction. Concurrently but not shown, other alignment mechanisms are also actuated to move the substrate in a second direction, that together with the movement of the substrate in the first direction, cooperatively move the substrate into a predetermined position. Generally, the substrate 106 is deposited on the support elements 302 of the support plate 160 by the atmospheric robot (not shown). The actuator 614, comprising the cooling plate 214 and actuator finger 616 are elevated by the lift mechanism 214 coupled to the cooling plate 214. As the actuator finger 616 is moved upwards, the contoured face 618 of the actuator finger 616 contacts the roller 612 of the alignment mechanism 602 causing the alignment mechanism to rotate the pushing member 604 towards the center of the support plate 160. If the substrate is mis-aligned towards the particular alignment mechanism shown in FIG. 8A–B, the pushing member 604 will contact the substrate 106 and urge the substrate in the first direction 630. As other alignment mechanisms (as similarly illustrated in FIG. 3) along the other edges of the support plate 160 urge the substrate in a second direction different than the first direction 630, the pushing member 604 rotates thereby allowing the substrate to move laterally along the alignment mechanism 602, typically in a direction perpendicular to the first direction 630 without damage to the substrate or particulate generation. The combined interaction with other alignment mechanisms place the substrate in a predetermined position that facilitates further handling and processing without damage due to substrate misalignment.

Additionally, the cooling plate 214 moves into a position close to processed a substrate 802 returning from the transfer chamber (not shown) during the alignment process. In this position, cooling of the substrate 802 begins congruently with the alignment process without additional need for independent actuators or controls within the load lock chamber 600 to facilitate both alignment and cooling.

Figure 9:
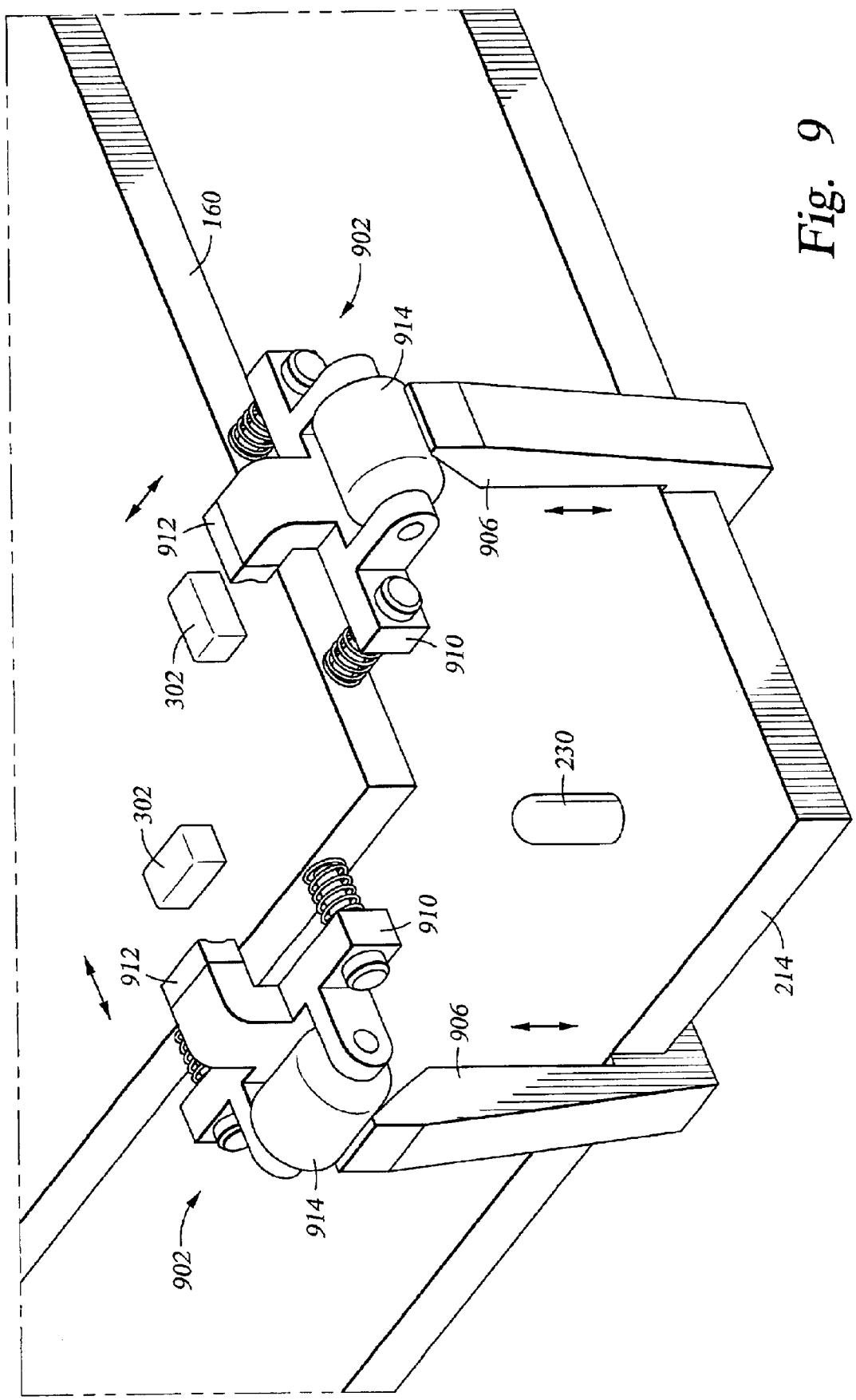
FIGS. 9–11 depict another embodiment of an alignment mechanism.
Figure 10:
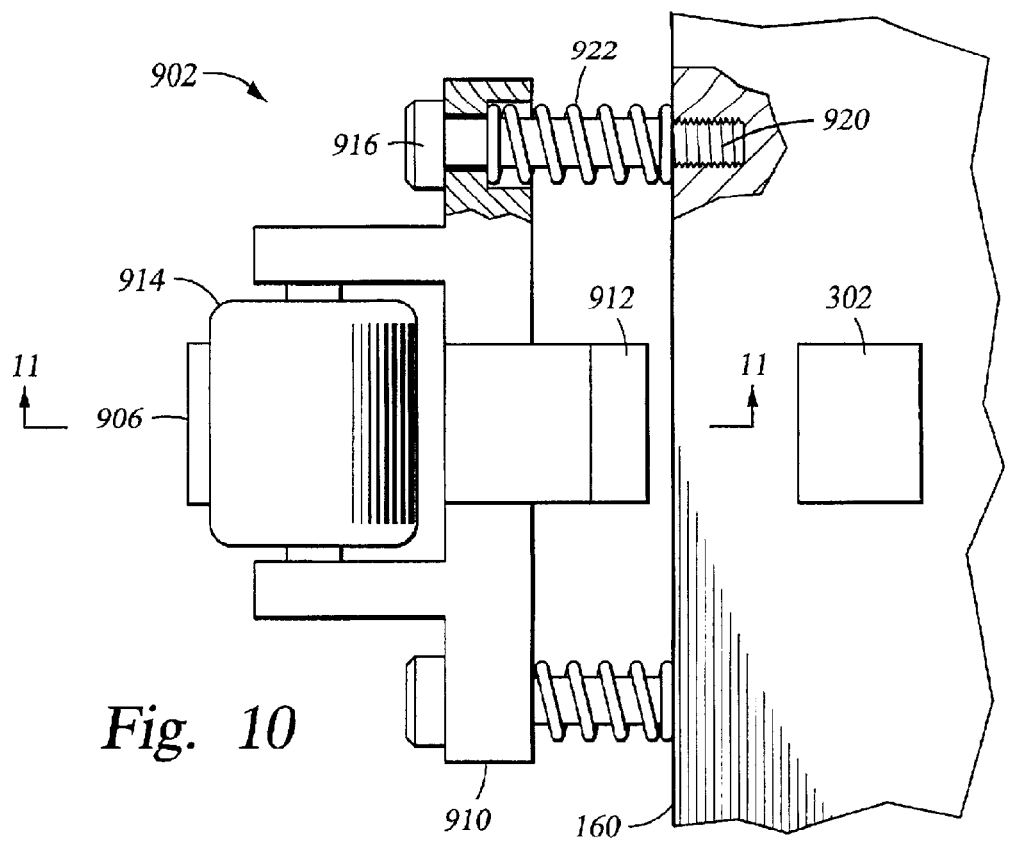
Figure 11:
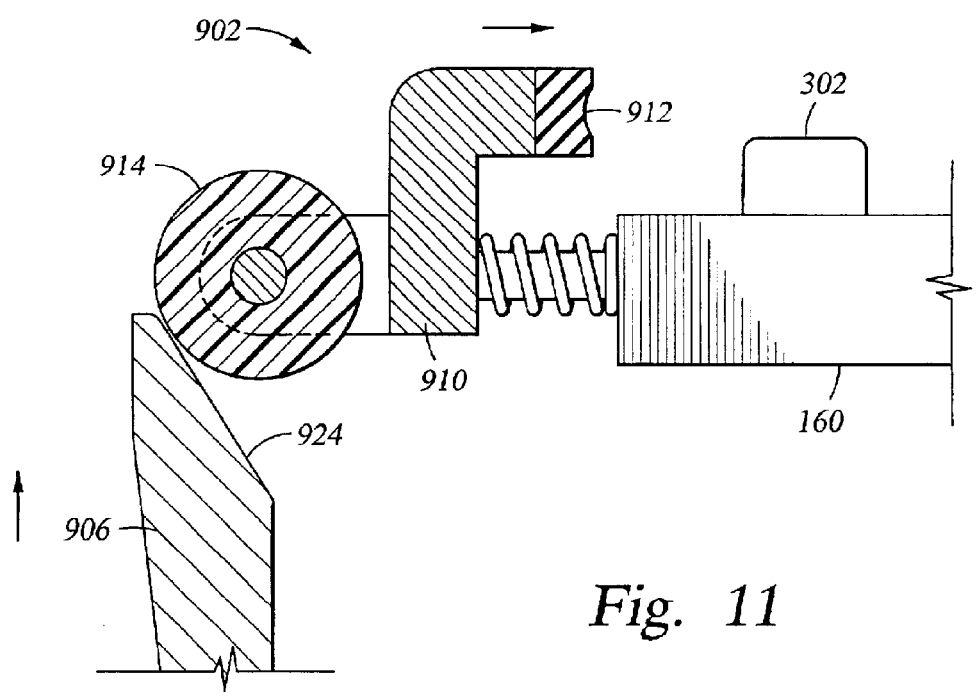

FIGS. 9–11 depicts another embodiment of an alignment mechanism 902 that may be utilized in a load lock chamber. Generally, at least one alignment mechanism 902 is coupled to each side of the support plate 160 (only two are shown disposed on adjacent sides of one corner of the support plate 160). Each alignment mechanism 902 may be actuated to move linearly towards the center of the support plate 160. The alignment mechanism 902 is set in motion by an actuator 904. The actuator 904 is generally similar to the actuator 616 described above, and includes an actuation finger 906 coupled to a cooling plate 214.

The alignment mechanism 902 is generally comprised of a central body 910 that has a pushing member 912 coupled on the side of the body 910 facing the support plate 160 and a roller 914 coupled on the opposite side of the body 910. Although the pushing member 912 is shown as fixed to the body 910, the pushing member 912 may be alternatively configured to rotate similar to the pushing members 402, 604 described above.

A plurality of guides generally couple the alignment mechanism 902 to the support plate 160 while allowing the alignment mechanism 902 to move relative to the support plate 160. In one embodiment, the guides include a pair of shoulder screws 916 each passing through a hole 918 formed in the alignment mechanism 902 and threaded into a hole 920 formed in the support plate 160. The side of the hole 918 facing the support plate 160 includes a counter bore that partially houses a spring 922. The spring 922 generally biases the alignment mechanism 902 away from the support plate 160 to provide adequate clearance between the pushing member 904 and substrates places on the support plate 160.

Substrates are generally aligned on the support plate 160 by elevating the cooling plate 214 to actuate the alignment mechanisms 902. The actuation fingers 902 contact the roller 914 with a contoured face 924 that displaces the alignment mechanism 902 towards the center of the support plate 160. As each alignment mechanism 902 is actuated along the fours sides of the support plate 160, a substrate seated on the support plate 160 is urged by the alignment mechanisms 902 into a predefined position that facilitates further handling and processing without damage due to substrate misalignment.

While the forgoing is directed to the some embodiments of the present invention, other and further embodiments of the invention may be devised without departing from the basic scope thereof, and the scope thereof is determined by the claims that follow.

What is claimed is:

1. An apparatus for supporting a substrate, comprising:
  a support plate having a first side adapted to support the substrate and a first edge bounding a portion of the first side;
  a first body rotationally disposed proximate the first edge; and
  a first pushing member radially coupled to the first body and adapted to move the substrate in a first direction parallel to the first side when the first body rotates, wherein the first pushing member has a first rotational axis defined by the rotation of the first body and a second rotational axis orientated different than the first rotational axis.

2. The apparatus of claim 1, wherein the second rotational axis is perpendicular to the first rotational axis.

3. The apparatus of claim 1, wherein the first pushing member has a concave face adapted to move the substrate.

4. The apparatus of claim 1, wherein the first body is coupled to an actuator.

5. The apparatus of claim 1, further comprising:
a roller coupled between a rotational axis of the first body and the first pushing member.

6. The apparatus of claim 1, wherein the first body further comprises:
a first flange;
a second flange;
a center portion coupling the first and second flanges;
a first hole formed through the first and second flanges coaxial with a first axis of rotation of the first body; and
a roller disposed between the first and second flanges, the roller having a second axis of rotation orientated parallel to the first axis of the first body, the second axis defined between the first axis and the center portion.

7. The apparatus of claim 6 further comprising a biasing member disposed between at least one of the first and second flanges and the roller, the biasing member adapted to rotate the first body about the first axis.

8. The apparatus of claim 6 further comprising:
a cooling plate; and
an actuation finger coupled to the cooling plate and adapted to engage the roller as the cooling plate is displaced relative to the first body.

9. The apparatus of claim 1, further comprising:
a second body rotationally disposed proximate a second edge of the support plate, the second edge disposed adjacent the first edge; and
a second pushing member radially coupled to the second body and adapted to move the substrate laterally in a second direction that is different from the first direction when the second body rotates.

10. The apparatus of claim 9 further comprising:
a third body rotationally disposed proximate a third edge of the support plate, the third edge disposed adjacent the first edge and opposite the second edge;
a third pushing member radially coupled to the third body and adapted to move the substrate in a direction opposite the first direction when the third body rotates;
a fourth body rotationally disposed proximate a fourth edge of the support plate, the fourth edge disposed opposite the second edge; and
a fourth pushing member radially coupled to the fourth body and adapted to move the substrate in a direction opposite the second direction when the fourth body rotates.

11. The apparatus of claim 1, wherein the first body has a rotational axis parallel to a plane of the first side.

12. An apparatus for supporting a substrate, comprising:
a first pushing member having a first rotational axis and a second rotational axis orientated perpendicular to the first rotational axis, the first pushing member adapted to move the substrate in a first direction;
a second pushing member having a third rotational axis disposed parallel to the first rotational axis and a fourth rotational axis orientated perpendicular to the third rotational axis, the second pushing member adapted to move the substrate in a second direction that is opposite the first direction;
a third pushing member having a fifth rotational axis disposed perpendicular to the first rotational axis and a sixth rotational axis orientated perpendicular to the fifth rotational axis, the third pushing member adapted to move the substrate in a third direction; and
a fourth pushing member having a seventh rotational axis disposed parallel to the fifth rotational axis and an eighth rotational axis orientated perpendicular to the seventh rotational axis, the first, third fifth and seventh axis laying in a single plane, the second pushing member adapted to move the substrate in a fourth direction that is opposite the third direction.

13. The apparatus of claim 12, wherein the first pushing member further comprises a concave face.

14. The apparatus of claim 13, wherein the third direction is tangential to the concave face of the first pushing member.

15. The apparatus of claim 12 further comprising:
an actuator coupled to at least one of the pushing members.

16. The apparatus of claim 12, wherein the actuator engages at least the first pushing member to rotate about the first axis.

17. A load lock chamber for transferring a substrate between a first environment and a second environment, the load lock chamber comprising;
a chamber body having a first substrate transfer port and a second substrate transfer port;
a support plate disposed within the chamber body and having a first side adapted to support the substrate passed through either the first or second substrate transfer ports;
a first body disposed proximate a first edge of the support plate and having a first rotational axis parallel to the first edge; and
a first pushing member coupled to the first body and having a second rotational axis perpendicular to the first rotational axis, the pushing member adapted to move the substrate in a first direction parallel to the first side when the body is rotated about the first axis.

18. The load lock chamber of claim 17, wherein the first pushing member has a concave face adapted to move the substrate.

19. The load lock chamber of claim 17, wherein the first body is coupled to an actuator.

20. The load lock chamber of claim 17, wherein the first body further comprises:
a first flange;
a second flange;
a center portion coupling the first and second flanges;
a first hole formed through the first and second flanges coaxial with a first axis of rotation of the first body; and
a roller disposed between the first and second flanges, the roller having a second axis of rotation parallel to the first axis of the first body, the second axis defined between the first axis and the center portion.

21. The load lock chamber of claim 20 further comprising a biasing member disposed between at least one of the first and second flanges and the roller, the biasing member adapted to rotate the first body about the first axis.

22. The load lock chamber of claim 20 further comprising:
- a cooling plate; and
- an actuation finger coupled to the cooling plate and adapted to push the roller as the cooling plate is displaced relative to the first body.

23. The load lock chamber of claim 17 further comprising:
- a second body rotationally disposed proximate a second edge of the support plate, the second edge disposed adjacent the first edge; and
- a second pushing member radially coupled to the second body and adapted to move the substrate in a second direction that is different that the first direction when the second body rotates.

24. The load lock chamber of claim 23, wherein the first direction is perpendicular to the second direction.

25. A bad lock chamber for transferring a substrate between a first environment and a second environment, the load lock chamber comprising;
- a chamber body having a first substrate transfer port and a second substrate transfer port;
- a support plate disposed within the chamber body and having a first side adapted to support the substrate passed through either the first or second substrate transfer ports;
- a first alignment mechanism disposed proximate a first edge of the support plate having a first pushing member having a first rotational axis parallel to the first edge, the pushing member adapted to move the substrate in a first direction when rotated about the first axis;
- a second alignment mechanism disposed proximate a second edge of the support plate and having a second pushing member having a second rotational axis parallel to the first rotational axis, the second pushing member adapted to move the substrate in a second direction that is opposite the first direction when rotated about the second axis;
- a third alignment mechanism disposed proximate a third edge of the support plate that is disposed between the first and second edges, the third alignment mechanism having a third pushing member having a third rotational axis perpendicular to the first rotational axis, the third pushing member adapted to move the substrate in a third direction that is perpendicular the first direction when rotated about the third axis;
- a fourth alignment mechanism disposed proximate a fourth edge of the support plate and having a fourth pushing member having a fourth rotational axis parallel to the third rotational axis, the fourth pushing member adapted to move the substrate in a fourth direction that is opposite the third direction when rotated about the fourth axis; and
- a cooling plate movably disposed within the chamber body and adapted to cause the first through fourth alignment mechanisms to rotate when moved towards the support plate.

26. The load lock chamber of claim 25, wherein the first pushing member has a surface that rotates about an axis that is perpendicular to the first rotational axis, wherein the third direction is tangential to the surface.

27. A method for aligning a substrate on a substrate support the method comprising:
- placing a substrate on a support;
- rotating a first pushing member about a first a defined parallel to the support to move the substrate in a first direction;
- rotating a second pushing member to move the substrate second direction different than the first direction; and
- rotating the first pushing member about a second axis defined perpendicular to the first axis.

28. The method of claim 27, wherein the step of rotating a first pushing member further comprises:
- elevating a cooling plate towards the support to cause the rotation of the first pushing member.

* * * * *